United States Patent
Klein

(10) Patent No.: US 9,420,682 B2
(45) Date of Patent: Aug. 16, 2016

(54) HETEROGENEOUS THERMAL INTERFACE

(71) Applicant: ABL IP Holding LLC, Conyers, GA (US)

(72) Inventor: Stephen Klein, Gahanna, OH (US)

(73) Assignee: ABL IP Holding LLC, Decatur, GA (US)

( * ) Notice: Subject to any disclaimer, the term of this patent is extended or adjusted under 35 U.S.C. 154(b) by 241 days.

(21) Appl. No.: 14/189,587

(22) Filed: Feb. 25, 2014

(65) Prior Publication Data

US 2014/0240929 A1     Aug. 28, 2014

Related U.S. Application Data

(60) Provisional application No. 61/768,889, filed on Feb. 25, 2013.

(51) Int. Cl.
    *H05K 7/20*      (2006.01)
    *H05K 1/02*      (2006.01)
    *H05K 3/00*      (2006.01)
    *H01L 23/42*      (2006.01)

(52) U.S. Cl.
    CPC ............ *H05K 1/0203* (2013.01); *H05K 3/0061* (2013.01); *H01L 23/42* (2013.01); *H01L 2924/0002* (2013.01); *H05K 2201/10106* (2013.01); *Y10T 29/4913* (2015.01)

(58) Field of Classification Search
    CPC .............. H05K 1/0203; H05K 3/0061; H05K 2201/10106; H01L 2924/0002; H01L 23/42; Y10T 29/4913
    USPC .................................................. 361/688–723
See application file for complete search history.

(56) References Cited

U.S. PATENT DOCUMENTS

| | | | | |
|---|---|---|---|---|
| 2004/0222433 A1* | 11/2004 | Mazzochette | ....... | H01L 25/0753 257/99 |
| 2005/0051359 A1* | 3/2005 | Logothetis | .............. | H01L 23/66 174/260 |
| 2007/0007540 A1* | 1/2007 | Hashimoto | ........... | H01L 33/642 257/94 |
| 2010/0071936 A1* | 3/2010 | Tan | ...................... | H05K 1/0204 174/252 |
| 2011/0272179 A1* | 11/2011 | Vasoya | ................ | H05K 1/0204 174/252 |
| 2013/0068439 A1* | 3/2013 | Zeng | ....................... | F21V 29/20 165/185 |
| 2014/0126203 A1* | 5/2014 | Kachala | .................. | F21V 29/22 362/235 |
| 2015/0219285 A1* | 8/2015 | Rantala | ................... | H01L 33/62 362/249.02 |

FOREIGN PATENT DOCUMENTS

DE      102010029529 A1 * 12/2011 ........... H05K 1/0203

* cited by examiner

*Primary Examiner* — Anthony Haughton
*Assistant Examiner* — Yahya Ahmad
(74) *Attorney, Agent, or Firm* — Kilpatrick Townsend & Stockton, LLP

(57) ABSTRACT

An electronic apparatus, such as a lighting fixture, includes a substrate, an electronic device such as a chip-on-board light emitting diode and a thermal interface located between the substrate and the electronic device. The thermal interface includes at least two distinct materials, including a dielectric material and a thermally conductive material. The dielectric material includes a cutout into which the thermally conductive material is located. The dielectric material can completely surround the perimeter of the electronic device or can be located proximate portions of the electronic device that are prone to arcing in order to protect the substrate from arcing. The electronic apparatus operates at a reduced temperature as compared to an electronic apparatus that does not include the thermal interface. Methods for making an electronic apparatus having a thermal interface with a discrete dielectric material and thermally conductive material are also described.

20 Claims, 6 Drawing Sheets

HETEROGENEOUS THERMAL INTERFACE

RELATED APPLICATION

The present application claims the benefit of U.S. Provisional Application No. 61/768,889, filed Feb. 25, 2013, the entire contents of which are incorporated herein by this reference.

FIELD OF THE INVENTION

Embodiments of the invention provide a heterogeneous thermal interface for electrically insulating high voltage electronic devices while also improving heat dissipation from such devices.

BACKGROUND

Electronic devices, such as, but not limited to, printed circuit boards ("PCBs) populated with light emitting diodes ("LEDs") or chip-on-board ("COB") LEDs, are typically required to include a material with high dielectric strength to electrically isolate the electronic device from the substrate on which it is mounted. However, these devices also require high performance thermal interfaces for effectively conducting heat away from the device during operation. Dielectric materials typically have poor thermal properties, and thermal interface materials typically have poor dielectric properties. One solution is to use two distinct layers—a dielectric layer on top of a thermal interface layer. This dual layer configuration, however, results in a significant reduction in thermal performance.

Another solution, shown in the COB system 100 in FIGS. 1 and 2, is to use a commercially available material that has been designed for the purpose of combining dielectric strength and thermal conductivity. Exemplary materials include, but are not limited to, silicone- and fiberglass-based thermally conductive insulator pads (e.g., Sil-Pad, manufactured by the Bergquist Company or Cho-Therm, manufactured by Parker Hannifin Corporation), acrylic-based thermal interface pads (e.g., 5589H, manufactured by 3M Company), and coated graphite sheets (e.g., HITHERM, manufactured by GrafTech International Holdings, Inc.). In such an embodiment, the thermal interface 110 is a homogeneous material that is mounted on a substrate 120. The electronic device 130 is, in turn, mounted onto the thermal interface. The thermal interface includes dielectric properties to electrically isolate the electronic device from the substrate. In addition, it has thermal conductivity properties to transfer heat generated by the electronic device to the substrate, which acts as a heat sink. While the homogeneous thermal interface materials provide an acceptable combination of dielectric and thermal conductivity properties, they fall short of the performance of materials designed to provide only one of these properties.

SUMMARY

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

In one embodiment, an electronic apparatus includes a substrate, an electronic device and a thermal interface located between the substrate and the electronic device. The thermal interface includes at least two distinct materials, a dielectric material and a thermally conductive material. The dielectric material includes a cutout into which the thermally conductive material is located.

The electronic device may include a perimeter. In some embodiments, the thermally conductive material is located between the substrate and the electronic device such that the thermally conductive material does not extend beyond the perimeter.

In certain embodiments, the dielectric material completely surrounds the perimeter. In other embodiments, the dielectric material is located between the substrate and electronic device proximate components on the electronic device that are susceptible to arcing such that the dielectric material protects the substrate from arcing from the components.

In an embodiment the apparatus is an electronic lighting apparatus. The electronic device may include at least one printed circuit board having at least one light emitting diode located thereon or include at least one chip-on-board light emitting diode.

The dielectric material may include one or more of an insulator, a polypropylene insulator, fish paper, aramid paper, inorganic paper, a polyimide based material, a silicone-based material, a fiberglass-based material, an acrylic-based material, and a coated graphite material. In certain embodiments the dielectric material is a polyimide film.

The thermally conductive material may include one or more of thermal grease, a grease replacement pad, thermal tape, a phase change material, a gap filler, a thermal gel, a silicone-based material, a fiberglass-based material, an acrylic-based material, and a coated graphite material. In some embodiments the thermally conductive material is a thermal gel.

The electronic device may operate at a temperature at least 10° C. lower than an electronic apparatus that does not include the thermal interface.

In an embodiment, a method for making an electronic apparatus includes locating a dielectric material on a substrate, the dielectric material having a cutout. A thermally conductive material is located within the cutout, the dielectric material and thermally conductive material forming a thermal interface. An electronic device is located on the thermal interface. Various embodiments of the method are described herein.

BRIEF DESCRIPTION OF THE DRAWINGS

Illustrative embodiments of the present invention are described in detail below with reference to the following drawing figures.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 1:
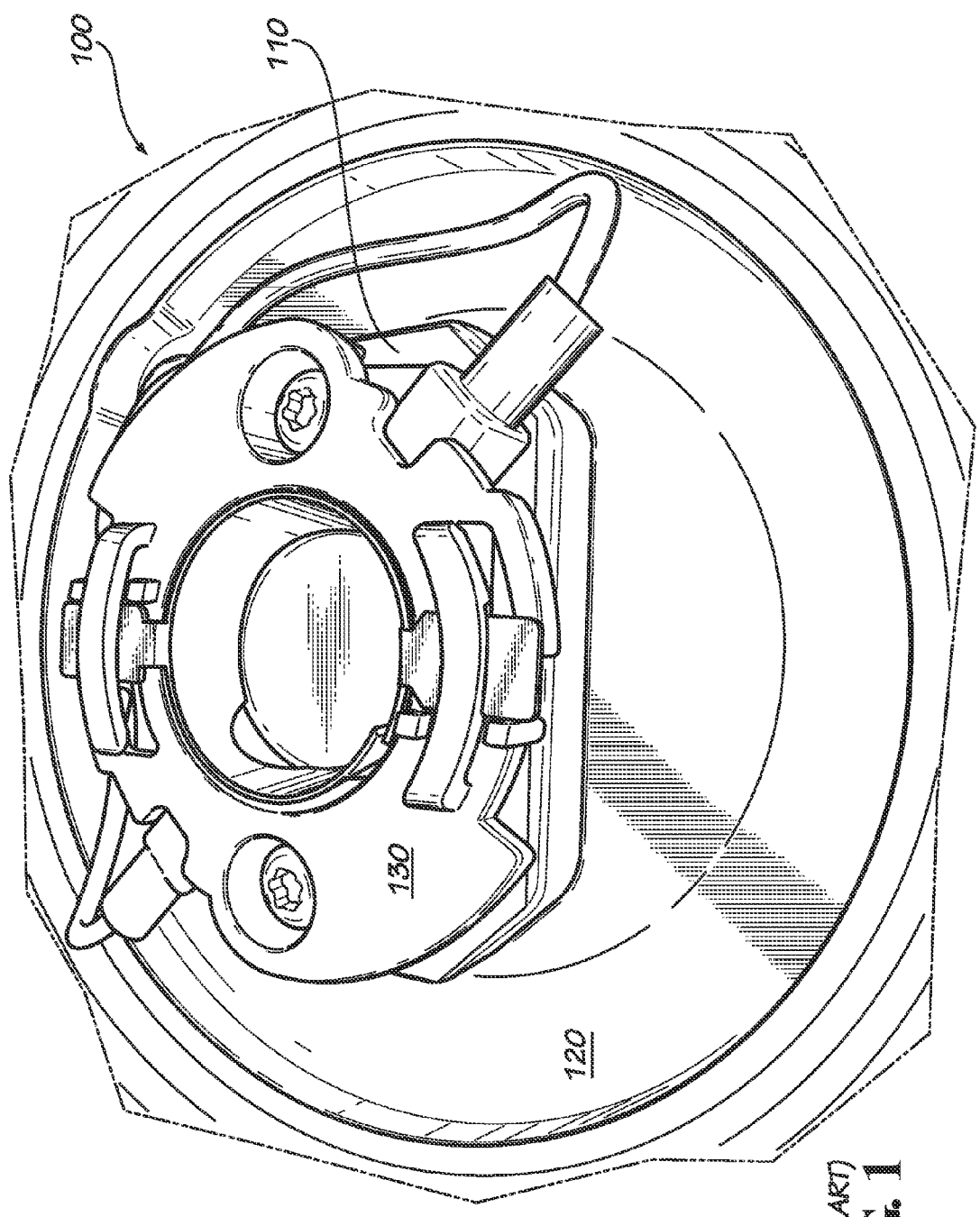
FIG. 1 is a top perspective view of a prior art COB system utilizing a homogeneous thermal interface.
Figure 2:
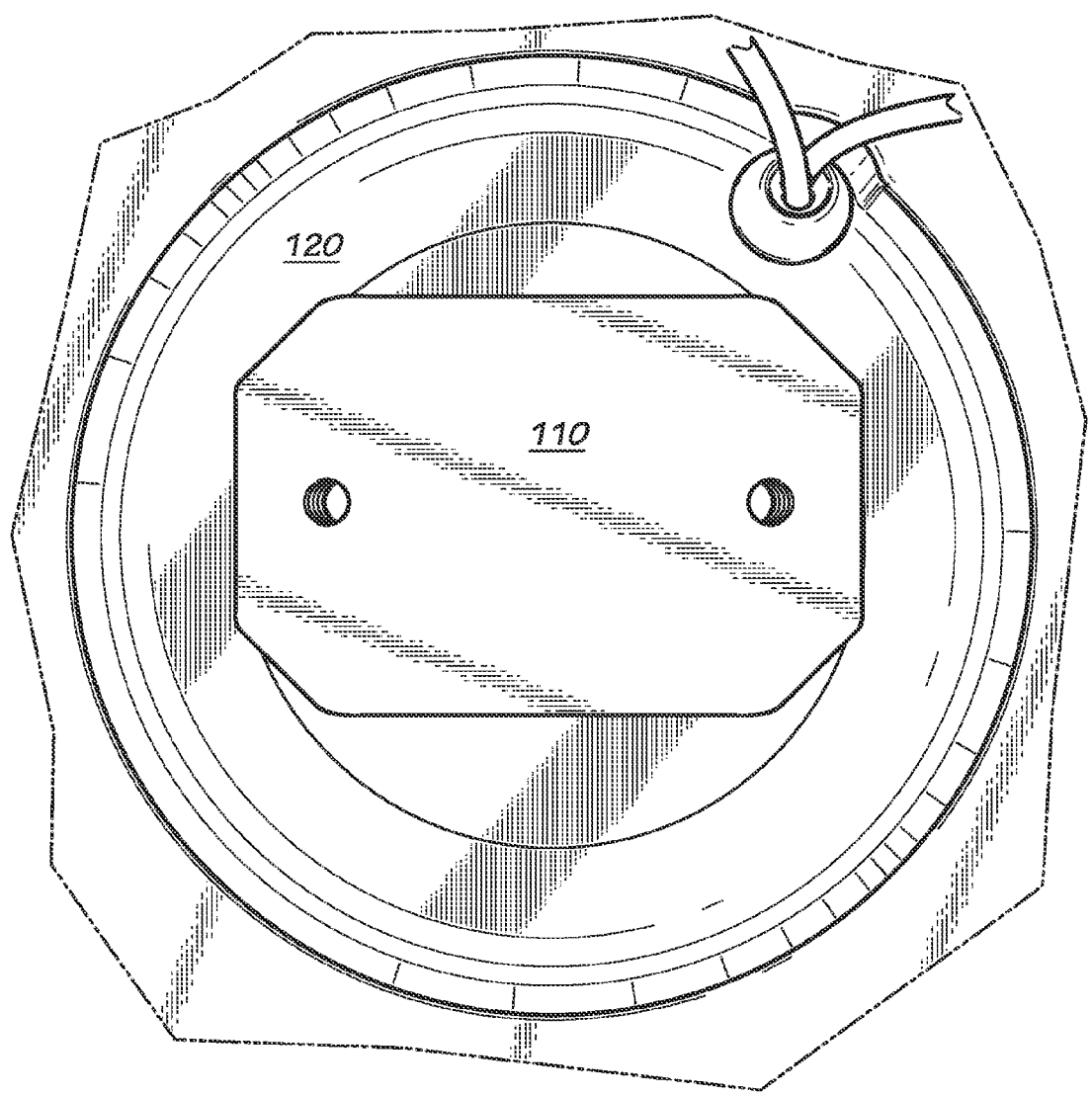
FIG. 2 is a top view of the prior art COB system of FIG. 1 in a partially assembled state.
Figure 3:
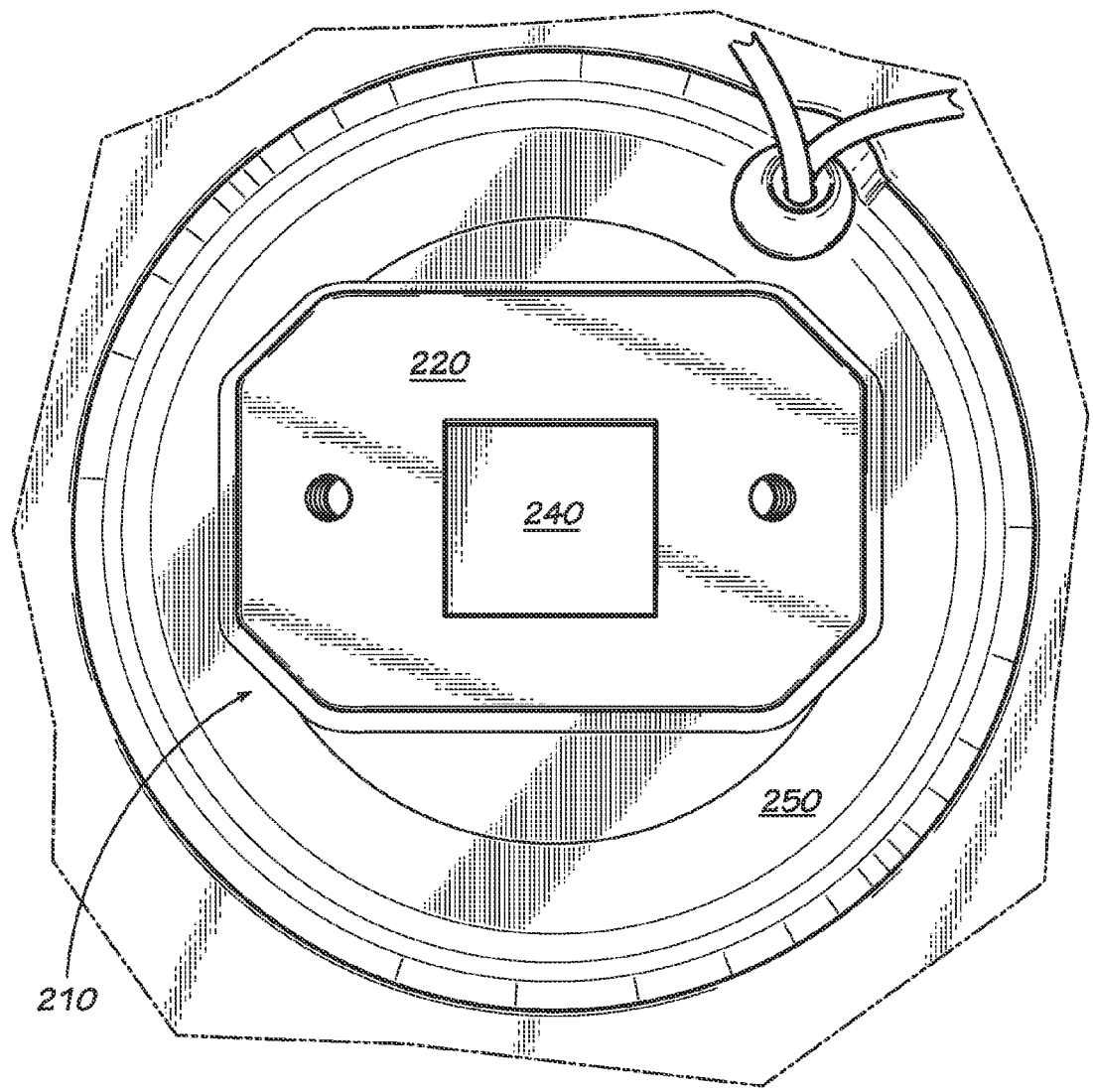
FIG. 3 is a top view of a heterogeneous thermal interface according to the present invention in a first partially assembled state.
Figure 4:
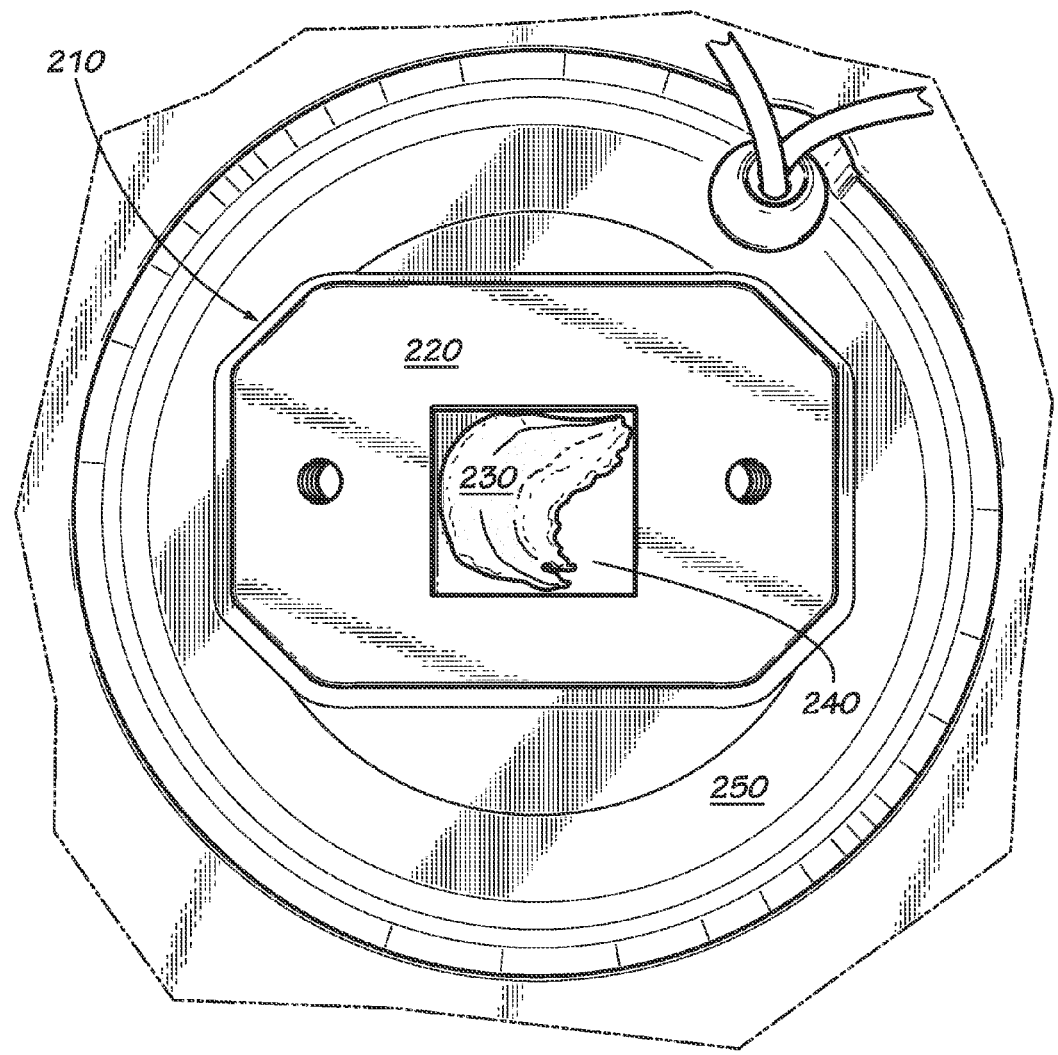
FIG. 4 is a top view of a heterogeneous thermal interface according to the present invention in a second partially assembled state.
Figure 5:
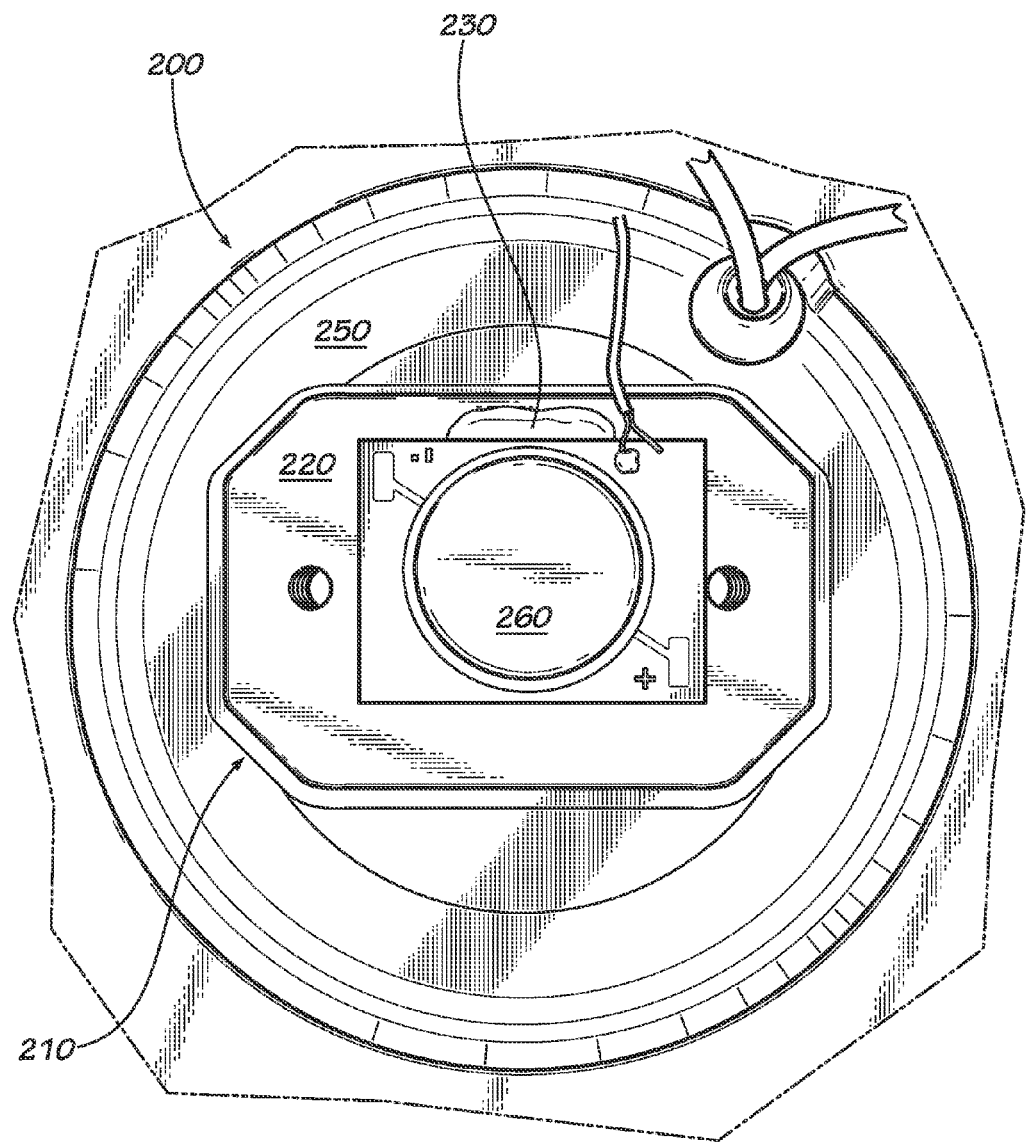
FIG. 5 is a top view of a COB system including a heterogeneous thermal interface according to the present invention.
Figure 6:
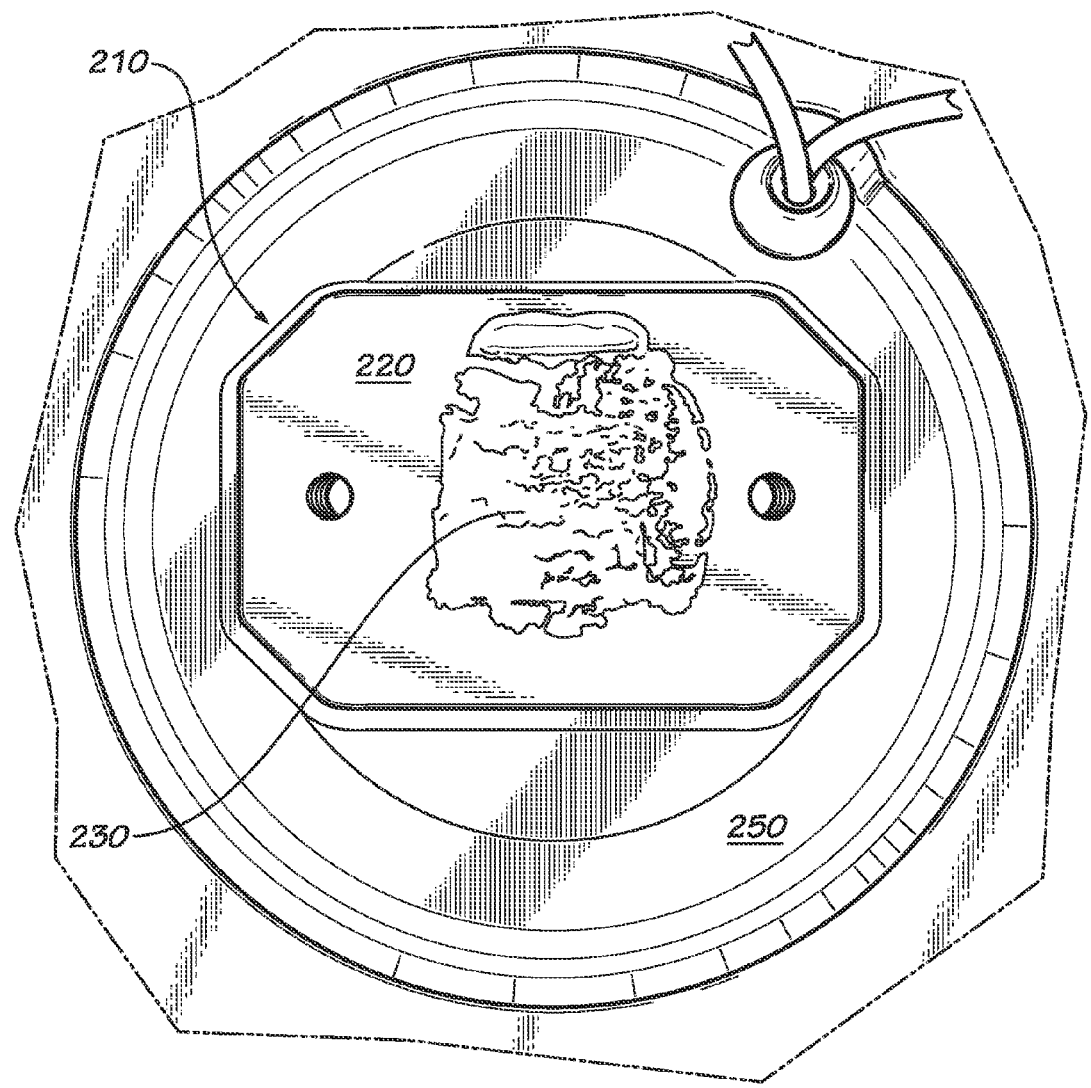
FIG. 6 is a top view of the COB system of FIG. 5 with the COB removed.

With reference to FIGS. 3-6 and as shown in the figures with an exemplary COB system 200, a thermal interface 210 includes at least two discrete materials: a first, dielectric material 220 and a second, thermally conductive material 230. The dielectric material 220 may include a cutout 240 into which the thermally conductive material 230 is positioned. The thermal interface 210 is thus heterogeneous in that the two materials 220, 230 are distinct from each other and generally do not contact each other except at the interface between the two materials 220, 230. This construction can be much less expensive than using specialized materials that are engineered to exhibit both thermal and dielectric properties.

One side of the thermal interface 210 may be mounted on a substrate 250. The substrate 250 may be anything, including but not limited to a component of a light fixture, such as a heat sink or reflector. An electronic device 260 (e.g., COB LED, PCB with LEDs, etc.) is mounted on the other side of the thermal interface. A COB LED is shown in the figures and described below but the electronic device certainly is not limited to that. Rather, the heterogeneous thermal interface 210 is contemplated for use with many different types of electronic devices, including, but not limited to, PCBs with LEDs, microchips, microcircuits, etc. The electronic device 260 (e.g., COB LED) is mounted substantially or completely over the second, thermally conductive material 230. In this manner, the first, dielectric material 220 extends around the perimeter of the electronic device 260 and protects the substrate 250 from arcing from the electrical components on the electronic device 260. Further, because the second, thermally conductive material 230 is in direct contact with the electronic device 260 and the substrate 250, heat generated by the electronic device 260 during use is conducted along the thermal path from the electronic device 260 to the second, thermally conductive material 230 and then to the substrate 250.

In some embodiments, the first, dielectric material 220 may be any material with good dielectric strength, including but not limited to polypropylene insulators (e.g., Formex™, manufactured by ITW Forme), fish paper or aramid paper (e.g., Nomex®, manufactured by DuPont), inorganic papers (e.g., ThermaVolt™, manufactured by 3M Company), and polyimide films (e.g., Kapton®, manufactured by DuPont). The first, dielectric material 220 may also be any of the materials identified in the Background above. In another embodiment, the dielectric material 220 is a polyimide film, such as Kapton®, manufactured by DuPont.

In certain embodiments, the second, thermally conductive material 230 may be any material with good thermally conductive properties, including but not limited to, thermal greases (e.g., Dow Corning® 340 Heat Sink Compound, manufactured by Dow Corning Corporation), grease replacement pads (e.g., Q-Pad, manufactured by The Bergquist Company), thermal tapes (e.g., THERMATTACH, from Parker Hannifin Corporation), phase change materials (e.g., THERMFLOW, manufactured by Parker Hannifin Corporation), and gap fillers (e.g., T-Putty, manufactured by Laird Technologies). The second, thermally conductive material 230 may also be any of the materials identified in the Background above. In another embodiment, the thermally conductive material 230 is a thermal gel such as THERM-A-GAP™ GEL30, available from Parker Hannifin Corporation. In some embodiments, the thermal gel does not have substantial adhesive properties, but, because it is sandwiched between the substrate and the electronic device 260, it is retained between these components. In other embodiments, the thermal gel may have adhesive properties so that it will adhere to the substrate 250 and electronic device 260 and provide strong contact (and thermal conductivity) between these components.

While the 220 dielectric material is described above as located around the perimeter of the electronic device 260, it will be appreciated that it need not completely surround the electronic device 260; the dielectric material 220 may be located adjacent only those portions of the electronic device 260 in which arcing is a concern. In such embodiments, it would be possible to increase the amount of thermally conductive material 230 in the thermal interface 210 relative to the dielectric material 220 to enhance heat transfer from the electronic device 260 to the substrate 250.

In some embodiments, a light fixture may include a substrate 250, a heterogeneous thermal interface 210 (such as that described above) mounted on the substrate 250, and an electronic device 260 such as a COB LED assembly. The substrate 250 may include one or a plurality of heterogeneous thermal interfaces 210 with an electronic device 260 mounted to each thermal interface 210. In another embodiment, multiple electronic device assemblies 260 may be mounted onto a single thermal interface 210. In such an embodiment, a dielectric material 220, such as a sheet of dielectric material, can include a plurality of cutouts 240 with a thermally conductive material 230 located within each of the cutouts 240 and an electronic device 260 located over each cutout 240 and its associated thermally conductive material 230.

In other embodiments, methods for manufacturing a light fixture include mounting a dielectric material 220 having at least one cutout 240 therein onto a substrate 250 in the fixture (e.g, housing, heat sink, reflector, etc.), inserting a thermally conductive material 230 into each of the at least one cutouts 240, and mounting an electronic device 260 such as a COB LED assembly over each of the at least one cutouts 240 such that the thermally conductive material 230 is sandwiched between each of the electronic devices 260 and the substrate 250. In some embodiments, the dielectric material 220 includes one cutout 240 and one electronic device 260, with a thermally conductive material 230 sandwiched between the substrate 250 and the electronic device 260. In further embodiments, the dielectric material 220 includes a plurality of cutouts 240 and electronic devices 260, with a thermally conductive 230 material positioned within each of the cutouts 240 and sandwiched between the substrate 250 and its associated electronic device 260.

In yet other embodiments, a heterogeneous thermal interface 210 may be formed prior to assembling the light fixture.

For example, a cutout 240 may be made in a dielectric material 220 and a thermally conductive material 230 may be positioned within the cutout 240 to form the heterogeneous thermal interface 210. The heterogeneous thermal interface 210 may then be packaged and shipped separately for use when the light fixture is assembled.

Use of heterogeneous thermal interfaces 210 such as described herein lead to significantly reduced temperatures as compared to prior art constructions such as those utilizing a homogeneous thermal interface (such as described in the Background above) and those using two distinct layers (such as described in the Background above). In some embodiments, the heterogeneous thermal interface results in a reduction in temperature of from about 10° C. to about 70° C. as compared to constructions without a heterogeneous thermal interface, such as those using a homogeneous thermal interface or two distinct layers. In other embodiments, the heterogeneous thermal interface results in a reduction of at least 10° C. as compared to prior constructions, or at least a 20° C. reduction, at least a 30° C. reduction, at least a 40° C. reduction, at least a 50° C. reduction or even at least a 60° C. reduction.

Tests were conducted comparing the thermal efficacy of embodiments of the heterogeneous thermal interface 210 with COB LEDs against known thermal interfaces used on the same COB LEDs. Various thermal interfaces (described under "Interface Type" in Table 1 below) were tested with five different types of COB LEDs (denoted by 2, 4, 5, and T5). The COB LEDs were activated and allowed to reach a steady state temperature (approximately 2 minutes after activation).

layered construction such as described in the Background above (see Row G in Table 1). Embodiments of the heterogeneous thermal interface reduced the temperature by 43-63° C. compared to those using a dielectric alone (see Rows D and E in Table 1). Improved thermal management of the LEDs is desirable because, as LEDs run hotter, they produce less light, degrade more quickly, and are at higher risk for catastrophic failure. Photometric testing has shown that use of a heterogeneous thermal interface such as disclosed herein leads to a 2.3% increase in lumen output (compared to a homogeneous interface) because of the LED temperature reduction.

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

That which is claimed is:

1. An electronic apparatus comprising:
    a substrate;
    an electronic device; and
    a thermal interface located between the substrate and the electronic device, the thermal interface comprising at least two distinct materials, the at least two distinct materials comprising a dielectric material and a thermally conductive material, wherein the dielectric material comprises a cutout into which the thermally conductive material is located, and wherein the electronic device is in direct contact with the thermally conductive material.

2. The electronic apparatus of claim 1, wherein the electronic device comprises a perimeter and the thermally con-

TABLE 1

| Row | Interface Type | | COB Designator | | | |
|---|---|---|---|---|---|---|
| | | | 2 | 4 | 5 | T5 |
| A | None | No interface | 116 | 101 | | |
| B | Homogeneous | GrafTech eGRAF ® HT-1205AP (AP: adhesive on one side; plastic on other) | | | 87.2 | |
| C | Homogeneous | Sur-Seal Sur Cool ™ SFR 200V | 112 | | | |
| D | Dielectric Only | Dupont Kapton ® 100MT (no adhesive) | 128 | 112 | | |
| E | Dielectric Only | Dupont Kapton ® 100MT + 3M PSA (pressure sensitive adhesive) | 129 | 129 | | |
| F | Layered | Dupont Kapton ® 100MT + GrafTech eGRAF) ® HT-1205A (A: adhesive on one side; no additional adhesive) | 106 | 92 | | |
| G | Layered | Dupont Kapton ® 100MT (no adhesive) + Parker Chomerics GEL30 | | | 81 | |
| H | Heterogeneous | Dupont Kapton ® 100MT (no adhesive) with center cutout + Parker Chomerics GEL30 | | | 69 | |
| I | Heterogeneous | Dupont Kapton ® 100MT + 3M PSA with center cutout + Parker Chomerics GEL30 | 70.5 | 65.8 | 64.7 | 65.5 |
| J | Layered | Dupont Kapton ® 100MT + Bergquist Q-pad 3 grease replacement | | | 113 | |
| K | Thermal Only | Bergquist Q-pad 3 grease replacement | | | 97 | |
| L | Thermal Only | Bergquist Q-pad 3 grease replacement after heat/cool cycle | | | 95.2 | |

** Temperature [° C.] measured using thermal camera, 2 min. after energizing COB At the 2 minute mark, the temperature of the COB LEDs was tested and the temperature measurements are reflected in Table 1. Embodiments of the heterogeneous thermal interface (Rows H and I in Table 1) led to a COB LED temperature reduction of between 12° and 60° compared to various constructions using known thermal interfaces. Embodiments of the heterogeneous thermal interface reduced the COB temperature by 12° C. compared to a thermal interface having a ductive material is located between the substrate and the electronic device such that the thermally conductive material does not extend beyond the perimeter.

3. The electronic apparatus of claim 2, wherein the dielectric material completely surrounds the perimeter.

4. The electronic apparatus of claim 1, wherein the electronic device comprises components susceptible to arcing and the dielectric material is located between the substrate and the electronic device proximate the components such that the dielectric material protects the substrate from arcing from the components.

5. The electronic apparatus of claim 1, wherein the apparatus is an electronic lighting apparatus.

6. The electronic apparatus of claim 1, wherein the electronic device comprises at least one printed circuit board having at least one light emitting diode located thereon.

7. The electronic apparatus of claim 1, wherein the electronic device comprises at least one chip-on-board light emitting diode.

8. The electronic apparatus of claim 1, wherein the dielectric material comprises one or more of an insulator, a polypropylene insulator, fish paper, aramid paper, inorganic paper, a polyimide based material, a silicone-based material, a fiberglass-based material, an acrylic-based material, and a coated graphite material.

9. The electronic apparatus of claim 8, wherein the dielectric material comprises a polyimide based material, the polyimide based material comprising a polyimide film.

10. The electronic apparatus of claim 1, wherein the thermally conductive material comprises one or more of thermal grease, a grease replacement pad, thermal tape, a phase change material, a gap filler, a thermal gel, a silicone-based material, a fiberglass-based material, an acrylic-based material, and a coated graphite material.

11. The electronic apparatus of claim 10, wherein the thermally conductive material comprises a thermal gel.

12. The electronic apparatus of claim 1, wherein the electronic device operates at a temperature within a range of 64.7° C. to 70.5° C.

13. A method for making an electronic apparatus, comprising:

locating a dielectric material on a substrate, the dielectric material comprising a cutout;

locating a thermally conductive material within the cutout, the dielectric material and thermally conductive material forming a thermal interface; and locating an electronic device on the thermal interface such that the electronic device is in direct contact with the thermally conductive material of the thermal interface.

14. The method of claim 13, wherein the electronic device comprises a perimeter and the thermally conductive material is located between the substrate and the electronic device such that the thermally conductive material does not extend beyond the perimeter.

15. The method of claim 14, wherein the dielectric material completely surrounds the perimeter.

16. The method of claim 13, wherein the electronic device comprises components susceptible to arcing and the dielectric material is located between the substrate and the electronic device proximate the components such that the dielectric material protects the substrate from arcing from the components.

17. The method of claim 13, wherein the apparatus is an electronic lighting apparatus comprising:

at least one printed circuit board having at least one light emitting diode located thereon; or at least one chip-on-board light emitting diode.

18. The method of claim 13, wherein the dielectric material comprises one or more of an insulator, a polypropylene insulator, fish paper, aramid paper, inorganic paper, a polyimide based material, a silicone-based material, a fiberglass-based material, an acrylic-based material, and a coated graphite material.

19. The method of claim 13, wherein the thermally conductive material comprises one or more of thermal grease, a grease replacement pad, thermal tape, a phase change material, a gap filler, a thermal gel, a silicone-based material, a fiberglass-based material, an acrylic-based material, and a coated graphite material.

20. The method of claim 13, wherein the dielectric material comprises a polyimide film and the thermally conductive material comprises a thermal gel.

* * * * *